United States Patent
Aihara

(10) Patent No.: US 10,038,125 B2
(45) Date of Patent: Jul. 31, 2018

(54) LIGHT-EMITTING DEVICE AND METHOD FOR MANUFACTURING THE SAME

(71) Applicant: NICHIA CORPORATION, Anan-shi, Tokushima (JP)

(72) Inventor: Masato Aihara, Komatsushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/391,017

(22) Filed: Dec. 27, 2016

(65) Prior Publication Data

US 2017/0186924 A1    Jun. 29, 2017

(30) Foreign Application Priority Data

Dec. 28, 2015 (JP) ................................. 2015-255733

(51) Int. Cl.

| | |
|---|---|
| *H01L 33/50* | (2010.01) |
| *H01L 33/54* | (2010.01) |
| *H01L 33/46* | (2010.01) |
| *H01L 33/62* | (2010.01) |
| *H01L 33/20* | (2010.01) |

(52) U.S. Cl.
CPC ............ *H01L 33/508* (2013.01); *H01L 33/20* (2013.01); *H01L 33/46* (2013.01); *H01L 33/54* (2013.01); *H01L 33/62* (2013.01); *H01L 2933/0025* (2013.01); *H01L 2933/0041* (2013.01)

(58) Field of Classification Search
None
See application file for complete search history.

(56) References Cited

U.S. PATENT DOCUMENTS

2010/0193822 A1* 8/2010 Inobe .................. H01L 33/54
257/98
2010/0258830 A1  10/2010 Ide et al.
2010/0276712 A1  11/2010 Shaikevitch et al.
2012/0188772 A1   7/2012 Sakai et al.
2013/0183787 A1   7/2013 Inobe et al.
(Continued)

FOREIGN PATENT DOCUMENTS

JP       2005-057089 A    3/2005
JP       2007-67183 A     3/2007
(Continued)

*Primary Examiner* — Alexander Ghyka
(74) *Attorney, Agent, or Firm* — Squire Patton Boggs (US) LLP

(57) ABSTRACT

A light-emitting device in which a resin forming a reflective layer is reduced from creeping up a portion covering the upper surface of a light-emitting element, and a method for manufacturing the same, is disclosed. The light-emitting device includes a substrate, a light-emitting element on the substrate, the light-emitting element having at least one side surface and the upper surface, a fluorescent material layer on the side surface and the upper surface, a light-transmissive layer on the side surface and the upper surface with the fluorescent material layer sandwiched therebetween, and a reflective layer covering the side surface with the fluorescent material layer and the light-transmissive layer sandwiched therebetween, the reflective layer being not disposed on at least the upper surface.

15 Claims, 3 Drawing Sheets

(56) References Cited

U.S. PATENT DOCUMENTS

| | | | |
|---|---|---|---|
| 2014/0203305 A1* | 7/2014 | Kawano | H01L 33/486 257/88 |
| 2015/0034992 A1 | 2/2015 | Inobe et al. | |
| 2015/0115298 A1* | 4/2015 | Tomizawa | H01L 33/505 257/94 |
| 2015/0155447 A1 | 6/2015 | Beppu | |
| 2016/0268481 A1 | 9/2016 | Beppu | |
| 2016/0380160 A1 | 12/2016 | Beppu | |
| 2017/0062682 A1 | 3/2017 | Inobe et al. | |

FOREIGN PATENT DOCUMENTS

| | | |
|---|---|---|
| JP | 2008-66365 A | 3/2008 |
| JP | 2010-199547 A | 9/2010 |
| JP | 2012-059737 A | 3/2012 |
| JP | 2012-156162 A | 8/2012 |
| JP | 2014-130871 A | 7/2014 |
| JP | 2014-158011 A | 8/2014 |
| JP | 2015-106666 A | 6/2015 |
| WO | 2009/066430 A1 | 5/2009 |

* cited by examiner

LIGHT-EMITTING DEVICE AND METHOD FOR MANUFACTURING THE SAME

This application claims priority to Japanese Patent Application No. 2015-255733, filed on Dec. 28, 2015, the disclosure of which is hereby incorporated by reference in its entirety.

BACKGROUND

Field

The present disclosure relates to a light-emitting device with a light-emitting element, and a method for manufacturing the same.

Description of the Related Art

Light-emitting devices with light-emitting elements such as light-emitting diodes are used in many apparatuses including backlights for displays and lighting apparatuses, because such light-emitting devices can easily provide high light-emission efficiencies. Conventional light-emitting devices that are heavily used include light-emitting elements in cavities, and resin packages including resins that seal the light-emitting elements and contain fluorescent materials. Inner walls of the cavities of the resin packages reflect light from the light-emitting elements to enhance the light-emission efficiencies.

To miniaturize the light-emitting devices, in widely-used light-emitting devices, light-emitting elements are disposed on substrates, resin layers (fluorescent material layers) containing fluorescent materials cover the side surfaces and the upper surfaces of the light-emitting elements, and reflective layers are disposed on the surfaces of the fluorescent material layers outside the light-emitting elements, as with light-emitting devices in, for example, Japanese Unexamined Patent Application Publication No. 2012-156162.

In the light-emitting devices having constitutions as in Japanese Unexamined Patent Application Publication No. 2012-156162, portions of the fluorescent material layers, the portions covering the upper surfaces of the light-emitting elements, are usually higher than portions on which the reflective layers are disposed. In spite of such constitutions, at the time of forming the reflective layers, resins of the reflective layers may creep up portions of the fluorescent material layers, the portions covering the side surfaces of the light-emitting elements, and the reflective layers may be formed on the portions of the fluorescent material layers, the portions covering the upper surfaces of the light-emitting elements. In other words, what is called the creep-up phenomenon may occur.

The reflective layers formed on the portions of the fluorescent material layers, the portions covering the upper surfaces of the light-emitting elements, hinder the luminous flux and the light quality of the light-emitting devices, thereby causing the problem that the light-emission efficiencies of the light-emitting devices decrease and that emission of light having desired properties cannot be obtained.

SUMMARY

To address the above problems, embodiments according to the present disclosure have an object to provide a light-emitting device in which a resin forming a reflective layer is reduced from creeping up a portion covering the upper surface of a light-emitting element, and a method for manufacturing the same.

A light-emitting device according to an embodiment of the present disclosure includes a substrate, a light-emitting element on the substrate, the light-emitting element having at least one side surface and the upper surface, a fluorescent material layer on the side surface and the upper surface, a light-transmissive layer on the side surface and the upper surface with the fluorescent material layer sandwiched therebetween, and a reflective layer covering the side surface with the fluorescent material layer and the light-transmissive layer sandwiched therebetween. The reflective layer is not disposed on at least the upper surface.

A light-emitting device according to an embodiment of the present disclosure has a constitution that can reduce a resin forming a reflective layer from creeping up the upper surface of a light-emitting element. In particular, the constitution can reduce the resin forming the reflective layer from creeping up to a fluorescent material layer that covers the upper surface of the light-emitting element. A method for manufacturing a light-emitting device according to an embodiment of the present invention can provide a light-emitting device having a constitution that can reduce a resin forming a reflective layer from creeping up a portion of a fluorescent material layer, the portion covering the upper surface of a light-emitting element.

DETAILED DESCRIPTION OF EMBODIMENTS

Figure 1A:
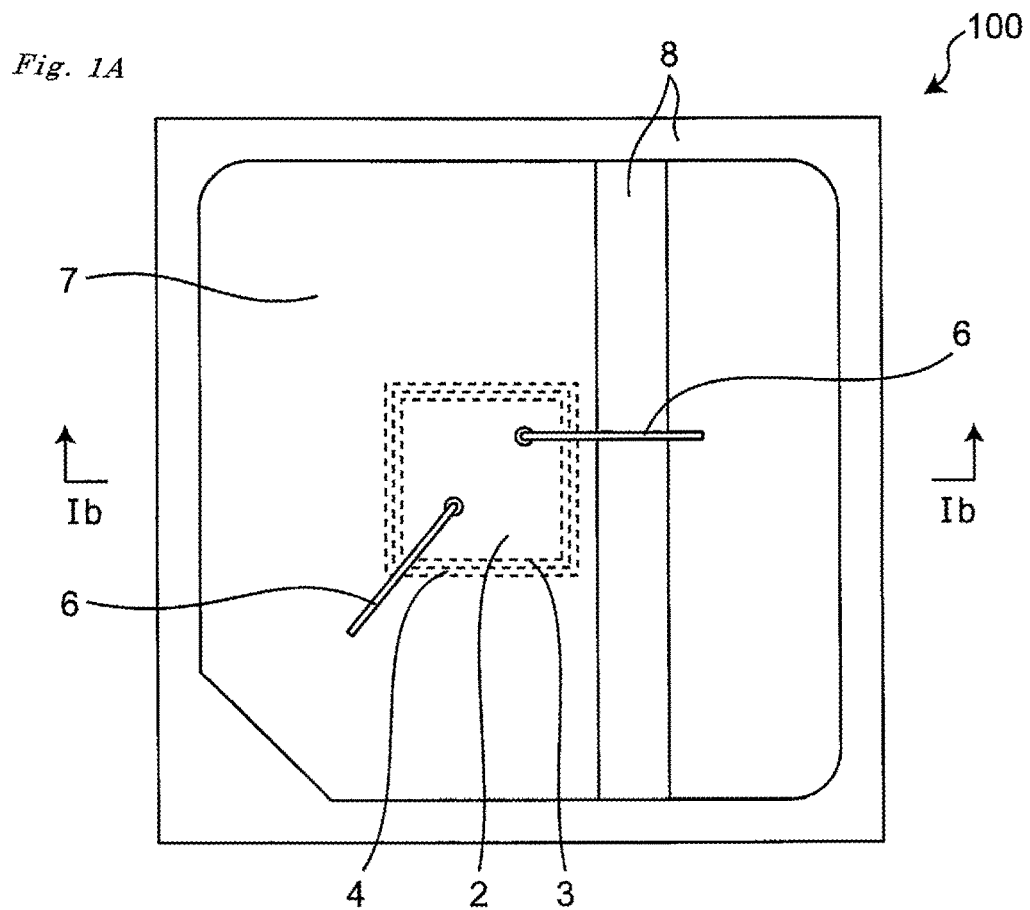
FIG. 1A is a schematic plan view of a light-emitting device 100 according to an embodiment of the present invention.

The following describes embodiments of the present invention referring to the accompanying drawings. The embodiments below will be described merely for the purpose of embodying the technical concept of the present invention, and the embodiments are not intended to limit the technical scope of the present invention. A constitution to be described corresponding to one embodiment can apply to other embodiments, unless otherwise noted. The descriptions below include terms indicating specific directions or positions (for example, "up", "down", "right", and "left" and other terms inclusive of these terms) as appropriate. Use of these terms is, however, intended to facilitate understanding of the invention referring to the drawings, and the meanings of these terms do not limit the technical scope of the present invention.

It is also noted that there is a case where magnitudes or positional relations of members illustrated in each drawing are exaggerated so as to clarify the descriptions. A portion with the same reference number represents the same portion or member in a plurality of drawings.

1. Light-Emitting Device

Figure 1B:
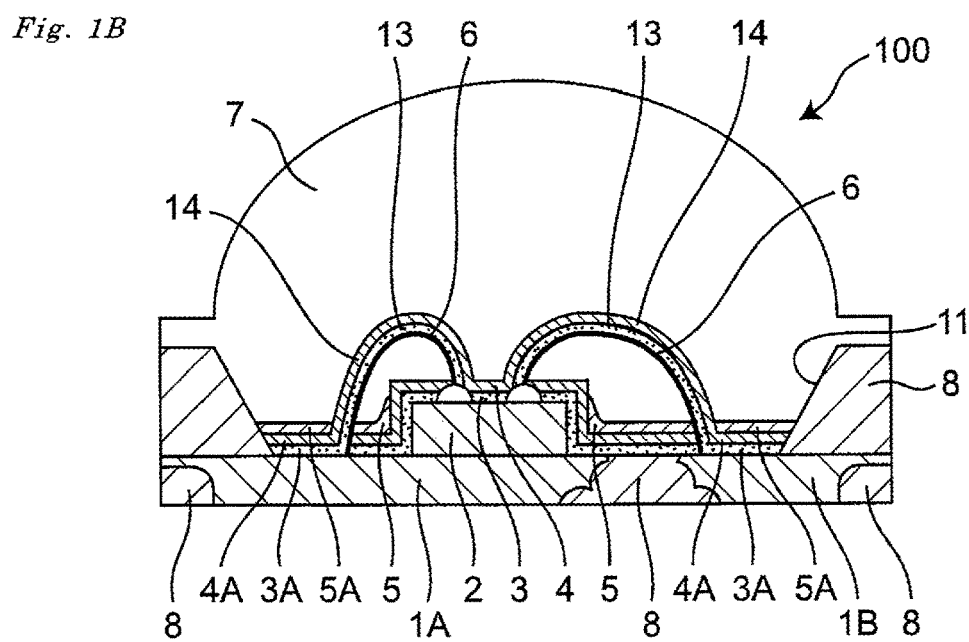
FIG. 1B is a schematic cross-sectional view along the line Ib-Ib in FIG. 1A.

FIG. 1A is a schematic plan view of a light-emitting device 100 according to an embodiment of the present invention. FIG. 1B is a schematic cross-sectional view along the line Ib-Ib in FIG. 1A. The light-emitting device 100 includes a substrate (resin package) 8, a light-emitting element 2 on the substrate 8, a fluorescent material layer 3 on the side surfaces and the upper surface of the light-emitting element 2, a light-transmissive layer 4 on the side surfaces and the upper surface of the light-emitting element 2 with the fluorescent material layer 3 sandwiched therebetween, and a reflective layer 5 covering the side surfaces of the light-emitting element 2 with the fluorescent material layer 3 and the light-transmissive layer 4 sandwiched therebetween so that the upper surface of the light-emitting element 2 will be exposed.

In the embodiment shown in FIG. 1A, a lead 1A and a lead 1B are exposed from the bottom surface of a depressed portion 11 in the resin package 8, and the light-emitting element 2 is disposed on the lead 1A. That is, the resin package 8, which has the depressed portion 11 and includes the lead 1A and the lead 1B at least partially exposed from the bottom surface of the depressed portion 11, is a substrate on which the light-emitting element 2 is disposed. Use of the resin package 8 as the substrate can allow light from the light-emitting element 2 to be emitted toward the open side of the depressed portion 11, thereby enhancing the luminance in the emission direction. Configurations of the substrate on which the light-emitting element 2 is disposed are not limited to this configuration. The light-emitting element 2 may be disposed on, instead of the resin package, a plate substrate that is made of an insulating material such as ceramics and glass and has wiring on its surface. In the case where such a plate substrate is used, a depressed portion may be formed in the substrate, and the light-emitting element 2 may be disposed in the depressed portion. Disposing the light-emitting element 2 in the depressed portion 11 of the substrate 8 can allow light from the light-emitting element 2 to be emitted toward the open side of the depressed portion 11, thereby enhancing the luminance in the emission direction.

The light-emitting element 2 may be electrically connected to the wiring on the substrate via at least one wire 6. In the embodiment shown in FIGS. 1A and 1B, the leads 1A and 1B function as the wiring on the substrate (resin package) 8, and two wires 6 connect the positive and negative electrodes of the light-emitting element 2 to the leads (wiring) 1A and 1B. Alternatively, the light-emitting element 2 may be electrically connected to the wiring on the substrate, for example, by the flip-chip mounting without the wires 6.

The fluorescent material layer 3 covers the side surfaces and the upper surface of the light-emitting element 2. In the embodiment shown in FIGS. 1A and 1B, the fluorescent material layer 3 covers substantially the entire upper and side surfaces of the light-emitting element 2. The fluorescent material layer 3 includes a fluorescent material that absorbs at least part of light emitted from the light-emitting element 2 and emits light having a different wavelength.

The fluorescent material layer 3 may include a fluorescent-material-layer extending portion 3A extending (formed) on the substrate. In the embodiment shown in FIG. 1B, the fluorescent-material-layer extending portion 3A is formed in the depressed portion 11 (on the bottom surface of the depressed portion 11) of the resin package 8. Since the fluorescent material layer 3 includes the fluorescent-material-layer extending portion 3A, the fluorescent material layer 3 can more securely cover the side surfaces of the light-emitting element 2.

The light-transmissive layer 4 is disposed on at least part of the side surfaces and at least part of the upper surface of the light-emitting element 2 with the fluorescent material layer 3 sandwiched therebetween. That is, the light-transmissive layer 4 is formed on the fluorescent material layer 3. In the embodiment shown in FIGS. 1A and 1B, the light-transmissive layer 4 covers substantially the entire upper and side surfaces of the light-emitting element 2 with the fluorescent material layer 3 sandwiched therebetween. The light-transmissive layer 4 transmits at least part, for example, equal to or more than 60%, more preferably equal to or more than 90% of incident light emitted from the light-emitting element 2. The light-transmissive layer 4 contains no fluorescent material.

The light-transmissive layer 4 may include a light-transmissive-layer extending portion 4A extending (formed) on at least part of the fluorescent-material-layer extending portion 3A. In the embodiment shown in FIG. 1B, the light-transmissive-layer extending portion 4A is formed in the depressed portion 11 of the substrate (resin package) 8 and disposed over the entire surface of the fluorescent-material-layer extending portion 3A so that the reflective layer 5 will not have contact with the fluorescent-material-layer extending portion 3A. This constitution can reduce the fluorescent material layer 3 including the fluorescent-material-layer extending portion 3A from being impregnated with the reflective layer 5 and reduce the reflective layer 5 from creeping up the upper surface of the light-emitting element 2 through the fluorescent material layer. Since the light-transmissive layer 4 includes the light-transmissive-layer extending portion 4A, the light-transmissive layer 4 can more securely cover the side surfaces of the light-emitting element 2 with the fluorescent material layer 3 sandwiched therebetween.

The reflective layer 5 covers the side surfaces of the light-emitting element 2 with the fluorescent material layer 3 and the light-transmissive layer 4 sandwiched therebetween. That is, the reflective layer 5 is formed on at least part of the portions on which the light-transmissive layer 4 covers the side surfaces of the light-emitting element 2 with the fluorescent material layer 3 sandwiched therebetween. The reflective layer 5 is formed so that the upper surface of the light-emitting element will be exposed. That is, no reflective layer 5 is formed on at least part of the upper surface (including the portions covered by at least one of the fluorescent material layer 3 and the light-transmissive layer 4), preferably substantially the entire upper surface of the light-emitting element 2.

The reflective layer 5 reflects light emitted from the light-emitting element 2 (light having wavelengths that are not converted by the fluorescent material) and light emitted from the fluorescent material, thereby improving the light-emission efficiency of the light-emitting device 100.

The reflective layer 5 may include a reflective-layer extending portion 5A extending (formed) on at least part of the light-transmissive-layer extending portion 4A. In the embodiment shown in FIG. 1B, the reflective-layer extending portion 5A is formed in the depressed portion 11 of the resin package 8. The reflective layer 5 including the reflective-layer extending portion 5A can reflect light traveling toward the bottom surface of the depressed portion 11 (or the light-transmissive-layer extending portion 4A), thereby further enhancing the light-emission efficiency of the light-emitting device 100. In the embodiment shown in FIG. 1B, the reflective layer 5 and the reflective-layer extending portion 5A are formed at the same time as an integrated body, but this constitution can be appropriately determined. In other words, the reflective layer 5 and the reflective-layer extending portion 5A may be formed at different steps.

In the case where the fluorescent-material-layer extending portion 3A, the light-transmissive-layer extending portion 4A, and the reflective-layer extending portion 5A are disposed, the wires 6 may be formed through the fluorescentmaterial-layer extending portion 3A, the light-transmissive-layer extending portion 4A, and the reflective-layer extending portion 5A, as shown in FIG. 1B.

In the light-emitting device 100, as described above, the light-transmissive layer 4 free of fluorescent materials is disposed on the fluorescent material layer 3, and the reflective layer 5 is formed with the light-transmissive layer 4 sandwiched therebetween. This constitution can reduce the material forming the reflective layer 5 from creeping up the portions of the light-transmissive layer 4, the portions covering the light-emitting element 2. This is because the light-transmissive layer 4 free of fluorescent materials is disposed at the top to smoothen the top surface, thereby reducing capillary action of the reflective layer 5. Also, incorporating no fluorescent material into the light-transmissive layer 4 can reduce the wettability of the top surface and reduce creep-up of the reflective layer 5.

The roughness of a surface of the light-transmissive layer 4, the surface on which the reflective layer 5 is formed, (that is, the roughness of the surface of the light-transmissive layer 4 on the side opposite to the fluorescent material layer 3) is smaller than the roughness of a surface of the fluorescent material layer 3, the surface on which the light-transmissive layer 4 is formed (that is, the roughness of the surface of the fluorescent material layer 3 on the light-transmissive layer 4 side). In other words, the roughness of the surface of the fluorescent material layer 3 on the light-transmissive layer 4 side is larger than the roughness of the surface of the light-transmissive layer 4 on the side opposite to the fluorescent material layer 3. As described above, the reflective layer 5 is formed on the surface, which has a roughness smaller than the surface roughness of the fluorescent material layer 3, of the light-transmissive layer 4, so that creep-up of the reflective layer 5 can be reduced.

The roughness of the surface of the light-transmissive layer 4 on the side opposite to the fluorescent material layer 3 is preferably equal to or less than 8 μm.

The roughness of the surface of the light-transmissive layer 4, the surface on which the reflective layer 5 is formed, (that is, the roughness of the surface of the light-transmissive layer 4 on the side opposite to the fluorescent material layer 3) is preferably equal to or smaller than half the roughness of the surface of the fluorescent material layer 3, the surface on which the light-transmissive layer 4 is formed (that is, the roughness of the surface of the fluorescent material layer 3 on the light-transmissive layer 4 side). In other words, the roughness of the surface of the fluorescent material layer 3 on the light-transmissive layer 4 side is preferably equal to or larger than twice the roughness of the surface of the light-transmissive layer 4 on the side opposite to the fluorescent material layer 3. This is because this constitution can more reliably reduce creep-up of the reflective layer 5 than in the case of a light-emitting device without the light-transmissive layer 4.

In a preferable embodiment with such surface roughnesses, significant effects can be obtained when the fluorescent material layer 3 is formed by spraying in which spray coating is performed. The spraying includes intermittent spray coating, in addition to continuous spray coating. In particular, forming the fluorescent material layer 3 by intermittent spray coating can result in a thin fluorescent material layer with a uniform thickness including the portions on the corners (edges) of the light-emitting element 2. This constitution reduces the difference in distances through which light emitted from the light-emitting element 2 travels through the fluorescent material layer 3, the difference depending on sites of the fluorescent material layer 3. Thus, an advantage of reducing color unevenness can be obtained. On the other hand, the surface roughness of the fluorescent material layer 3 formed by spraying tends to be larger than the surface roughness when a seal member containing a fluorescent material is formed by potting. Creep-up tends to occur when the reflective layer 5 is formed on the surface of the fluorescent material layer 3 formed by spraying. Thus, forming the light-transmissive layer 4 having a smaller surface roughness on the fluorescent material layer 3 formed by spraying has significant effects on reduction of creep-up.

Herein, the "surface roughness" means the arithmetic mean roughness Ra defined in JIS B 0601-1994. As a measurement apparatus, for example, a laser microscope "VK-9510" from KEYENCE Corporation can be used.

Fluorescent material layers (second fluorescent material layers) 13 may be formed on at least part of the upper surfaces of the wires 6. The second fluorescent material layers 13 can convert the wavelengths of part of light that has been emitted from the light-emitting element 2 and transmitted through the light-transmissive layer 4. For example, this constitution can cause the light that is part of light reflected in the depressed portion 11 and is traveling back toward the light-emitting element 2 side to be emitted toward the emission surface side after wavelength conversion by the second fluorescent material layers 13. Thus, the proportion of the light absorbed by the light-emitting element 2 can be reduced. The second fluorescent material layers 13 may have the same constitution as the fluorescent material layer 3, including the fluorescent material and the resin to be used. In the embodiment shown in FIG. 1B, the fluorescent material 3 and the second fluorescent material layers 13 are formed at the same time as an integrated body, but this constitution can be appropriately determined. In other words, the fluorescent material 3 and the second fluorescent material layers 13 may be formed at different steps.

Light-transmissive layers (second light-transmissive layers) 14 may be formed on at least part of the second fluorescent material layers 13 formed on the upper surfaces of the wires 6. Disposing the second light-transmissive layers 14 on the second fluorescent material layers 13 can reduce the material forming the reflective layer 5 from creeping up the wires 6 (second fluorescent material layers 13). The second light-transmissive layers 14 may have the same constitution as the light-transmissive layer 4, including the material to be used.

In the case where the second fluorescent material layers 13 are formed on the upper surfaces of the wires 6, the fluorescent material layers may not be formed on at least part of the lower surfaces of the wires 6. Not disposing the fluorescent material layers on at least part of the lower surfaces of the wires 6 has an advantage of reducing the reflective layer 5 from creeping up from the lower surfaces of the wires 6.

The light-emitting device 100 may include a seal member 7. The seal member 7 covers the light-transmissive layer 4 and the reflective layer 5. In the case where the light-emitting device 100 includes the wires 6, the seal member 7 covers the wires 6. The seal member 7 is formed of a material that can transmit at least part, for example, preferably equal to or more than 80% of incident light emitted by the light-emitting element 2. For example, as shown in FIG. 1B, the seal member 7 may have a convex upper surface to function as a lens. Alternatively, the seal member 7 may have a flat upper surface.

Next, the following describes details of each element of the light-emitting device 100.

(1) Light-Emitting Element

The light-emitting element 2 may be any light-emitting element and may be a light-emitting diode. The light-emitting element 2 may include a semiconductor stacked body and preferably includes a nitride-semiconductor stacked body. The semiconductor stacked body (preferably nitride-semiconductor stacked body) may include a first semiconductor layer (for example, an n-type semiconductor layer), a light-emitting layer, and a second semiconductor layer (for example, a p-type semiconductor layer) in this order.

It is preferable that both an electrode electrically connected to the first semiconductor layer and an electrode electrically connected to the second semiconductor layer be disposed on the same side (for example, on the surface on the second semiconductor layer side) of the semiconductor stacked body.

The types and the materials of the first semiconductor layer, the light-emitting layer, and the second semiconductor layer are not limited to particular types or materials, and their examples include various semiconductors such as group III-V compound semiconductors and group II-VI compound semiconductors. Specifically, $In_XAl_YGa_{1-X-Y}N$ ($0 \leq X$, $0 \leq Y$, $X+Y \leq 1$) may be used as a preferable nitride semiconductor material. The thickness and layer structure known in the field of the invention may apply to the thickness and layer structure of each layer.

(2) Fluorescent Material Layer

The fluorescent material layer 3 contains a resin and a fluorescent material. As will be described later in detail, in the case where the fluorescent material layer 3 is formed by spraying including intermittent spray coating, one or more selected from the fluorescent materials below may be used as the fluorescent material. The resins below may be used as the resin. Preferable thicknesses of the fluorescent material layer 3 include thicknesses of 20 μm to 100 μm. In particular, the thickness is preferably 20 μm to 100 μm when the fluorescent material layer 3 having a comparatively uniform thickness can be obtained by forming the fluorescent material layer 3 by intermittent spray coating. The mean particle diameter of the fluorescent material contained in the fluorescent material layer 3 is preferably 3 μm to 30 μm. The mean particle diameter of the fluorescent material can be determined by an air permeability method called Fisher Sub Sieve Sizer's No.

Fluorescent Material (i) Garnet fluorescent materials such as aluminum-garnet fluorescent materials (for example, cerium-activated yttrium-aluminum-garnet (YAG) fluorescent materials and cerium-activated lutetium-aluminum-garnet (LAG) fluorescent materials)

(ii) Europium and/or chromium-activated nitrogen-containing calcium aluminosilicate ($CaO-Al_2O_3-SiO_2$) fluorescent materials (iii) Europium-activated silicate ($(Sr,Ba)_2SiO_4$) fluorescent materials (iv) β-SiAlON fluorescent materials (v) Nitride fluorescent materials such as CASN ($CaAlSiN_3$:Eu) and SCASN fluorescent materials (vi) Rare-earth nitride fluorescent materials such as $LnSi_3N11$ and LnSiAlON fluorescent materials (Ln is a rare earth element)

(vii) Oxynitride fluorescent materials such as $BaSi_2O_2N_2$:Eu and $Ba_3Si_6O_{12}N_2$:Eu fluorescent materials (viii) Manganese-activated fluoride-complex fluorescent materials (for example, KSF ($K_2SiF_6$:Mn) fluorescent materials)

(ix) Sulfide fluorescent materials such as CaS (CaS:Eu), $SrGa_2S_4$ ($SrGa_2S_4$:Eu), $SrAl_2O_4$, and ZnS fluorescent materials (x) Chlorosilicate fluorescent materials (xi) Semiconductor materials such as group II-VI, group III-V, and group IV-VI semiconductors, specifically what are called nanocrystals, which are nano-sized highly dispersible particles such as CdSe, core-shell $CdS_xSe_{1-x}$/ZnS, and GaP, and light-emitting substances called quantum dots (Q-Dots). These materials may be used singly or in combination.

Since quantum-dot fluorescent materials are unstable, the surfaces of the particles may be covered or stabilized with poly(methyl methacrylate) (PMMA), silicone resins, epoxy resins, or hybrid resins of these resins.

Resin

The resin used for the fluorescent material layer 3 is preferably light transmissive. For example, the resin transmits equal to or more than 60%, more preferably equal to or more than 90%, of light emitted from the light-emitting element. Thermosetting resins and thermoplastic resins can be used as the resin. Specifically, examples of the resins include epoxy resin compositions, modified epoxy resin compositions (such as silicone-modified epoxy resins), silicone resin compositions, modified silicone resin compositions (such as epoxy-modified silicone resins), hybrid silicone resins, unsaturated polyester resins, polyimide resin compositions, modified polyimide resin compositions, polyamide resins, poly(ethylene terephthalate) resin, poly(butylene terephthalate) resin, poly(cyclohexane terephthalate) resin, polyphthalamide (PPA), polycarbonate resins, poly(phenylene sulfide) (PPS), liquid crystal polymers (LCPs), ABS resin, phenolic resins, acrylic resins, PBT resin, urea-formaldehyde resins, BT resin, and polyurethane resins.

Additive

The fluorescent material layer 3 may contain additives having functions such as filling, light diffusing, and coloring, as appropriate. Examples of the additives include fibrous fillers such as glass fiber and wollastonite, inorganic fillers such as aluminum nitride and carbon, silica, titanium oxide, zinc oxide, zirconium oxide, magnesium oxide, glass, and sintered bodies of fluorescent materials and inorganic binders.

(3) Light-Transmissive Layer

For example, the light-transmissive layer 4 may be formed of a resin. Thermosetting resins and thermoplastic resins can be used as the resin constituting the light-transmissive layer 4, for example. Specifically, examples of the resins include epoxy resin compositions, modified epoxy resin compositions (such as silicone-modified epoxy resins), silicone resin compositions, modified silicone resin compositions (such as epoxy-modified silicone resins), hybrid silicone resins, unsaturated polyester resins, polyimide resin compositions, modified polyimide resin compositions, polyamide resins, poly(ethylene terephthalate) resin, poly(butylene terephthalate) resin, poly(cyclohexane terephthalate) resin, polyphthalamide (PPA), polycarbonate resins, poly(phenylene sulfide) (PPS), liquid crystal polymers (LCPs), ABS resin, phenolic resins, acrylic resins, PBT resin, urea-formaldehyde resins, BT resin, and polyurethane resins.

The light-transmissive layer 4 may contain a filler. The light-transmissive layer 4 is preferably made of only resin without filler. Using the light-transmissive layer 4 free of fillers or the like reduces unevenness of the surface due to the fillers or the like, thereby further reduces creep-up of the reflective layer 5. The light-transmissive layer 4 may be constituted of light-transmissive materials other than resins, for example, glass.

(4) Reflective Layer

The material forming the reflective layer 5 is not limited to particular materials. The material may be any materials including ceramics, resins, dielectric bodies, pulp, glass, and composite materials of these materials. Among these materials, resins are preferable in view of capability of being easily formed into desired shapes.

The reflective layer 5 has a reflectance of light emitted from the light-emitting element 2 of equal to or more than 60%, preferably equal to or more than 90%.

The above material such as a resin may contain light-reflective materials, light-scattering materials, colorants, or other materials, such as titanium oxide, silicon dioxide, zirconium dioxide, potassium titanate, alumina, aluminum nitride, boron nitride, mullite, niobium oxide, zinc oxide, barium sulfate, and various rare-earth oxides (for example, yttrium oxide and gadolinium oxide), so that the reflective layer 5 will reflect incident light.

In the case where the reflective layer 5 is formed using a resin, thermosetting resins and thermoplastic resins can be used as the resin. Specifically, examples of the resins include epoxy resin compositions, modified epoxy resin compositions (such as silicone-modified epoxy resins), silicone resin compositions, modified silicone resin compositions (such as epoxy-modified silicone resins), hybrid silicone resins, unsaturated polyester resins, polyimide resin compositions, modified polyimide resin compositions, polyamide resins, poly(ethylene terephthalate) resin, poly(butylene terephthalate) resin, poly(cyclohexane terephthalate) resin, polyphthalamide (PPA), polycarbonate resins, poly(phenylene sulfide) (PPS), liquid crystal polymers (LCPs), ABS resin, phenolic resins, acrylic resins, PBT resin, urea-formaldehyde resins, BT resin, and polyurethane resins.

(5) Seal Member

In the case where the seal member 7 is disposed, the resin constituting the seal member 7 may be any resins. For example, a resin selected from the resins exemplified as the resin constituting the light-transmissive layer 4 may be used. The same type of resin may be used for both the seal member 7 and the light-transmissive layer 4, or different types of resin may be used.

2. Method for Manufacturing Light-Emitting Device

The following describes an embodiment of a method for manufacturing the light-emitting device 100.

FIGS. 2A and 2B and FIGS. 3A to 3C are schematic cross-sectional diagrams illustrating the embodiment of the method for manufacturing the light-emitting device 100.

(1) Disposing the Light-Emitting Element on the Substrate

The light-emitting element 2 is disposed on the substrate (resin package) 8. For example, a molten resin is poured into a mold in which the leads 1A and 1B have been located, and the resin is cured to give the resin package 8. Next, the light-emitting element 2 is located in a predetermined position on the lead 1A exposed from the bottom surface of the depressed portion 11 in the resin package 8 using any method such as die bonding. After the light-emitting element 2 is located, the electrodes of the light-emitting element 2 are electrically connected to the lead 1A and the lead 1B via the wires 6 by wire bonding.

(2) Forming Fluorescent Material Layer

The fluorescent material layer 3 is formed on the upper surface and the side surfaces of the light-emitting element 2. The fluorescent material layer 3 may include the fluorescent-material-layer extending portion 3A. The second fluorescent material layers 13 may be formed on the wires 6.

The fluorescent material layer 3 may be formed by any method. Examples of the method for forming the fluorescent material layer 3 include 1) spraying, in which a slurry containing a fluorescent material and a resin is sprayed to form the fluorescent material layer, 2) electric deposition (electrodeposition coating), in which a target (light-emitting element 2) of coating is immersed in a water-soluble resin containing a fluorescent material, and a voltage is applied between the water-soluble resin and the target of coating, and 3) electrostatic coating, in which a resin and a fluorescent material that are electrically-charged and powdered are used, and a voltage is applied between a spray gun that sprays the powder and the target (light-emitting element 2) of coating with the fluorescent material layer.

Among these methods, intermittent spray coating, which is a type of spraying, is preferably used to form the fluorescent material layer 3. This is because spraying can provide the fluorescent material layer 3 having a uniform thickness. A method for forming the fluorescent material layer 3 by intermittent spray coating will be described referring to FIGS. 2A and 2B.

First, a slurry 23 is provided using a resin exemplified as the resin forming the fluorescent material layer 3, a fluorescent material, and a solvent. The solvent is not limited to particular substances as long as the resin used can dissolve in the solvent. Examples of the solvent include linear hydrocarbons such as n-hexane and n-heptane, aromatic hydrocarbons such as toluene, ketone solvents such as acetone, alcohols such as isopropyl alcohol, ester solvents such as dimethyl carbonate, and organic solvents such as alternative solvents in which solubilities are equivalent to solubilities in the above solvents. These solvents can be used singly or in combination of equal to or more than two. Among these solvents, solvents containing ester solvents, in particular, solvents containing carbonate ester solvents are preferable.

The viscosity of the slurry 23 is preferably adjusted to about 0.01 to 1000 mPa·s, more preferably about 0.1 to 100 mPa·s or about 0.1 to 10 mPa·s. The viscosity can be controlled by adjusting as appropriate the types and the quantities of the resin, the solvent, and the fluorescent material (and the additive, as appropriate). For example, a mixture with a mass ratio of fluorescent material:resin:solvent:filler of 2 to 40:5 to 20:10 to 200:0.5 to 2 may be used as the slurry. The slurry 23 being the mixture with such a ratio can easily apply to spraying of intermittent spray coating, and the fluorescent material layer 3 can be more uniformly attached to the light-emitting element 2.

Next, a protective film 21 is formed on portions of the resin package 8 on which the light-emitting element 2 has been disposed, the portions on which the fluorescent material layer 3 is not to be formed. For example, a metal mask having an opening can be used as the protective film 21. By spraying, the fluorescent material layer 3 (that may include the fluorescent-material-layer extending portion 3A) and the second fluorescent material layers 13 can be formed on the portions on which the protective film 21 has not been formed.

Spraying of intermittent spray coating can be performed using, for example, a pulse-type spray device (pulse spray device). The "pulse-type" means that the device operates while ON and OFF states are intermittently switched. In other words, the pulse spray device can spray the slurry 23 and air through a spray nozzle 20 while the ON and OFF states are intermittently and repeatedly switched.

In spraying of intermittent spray coating, the velocity of the air can be reduced while maintaining the spray velocity of the slurry 23 from the spray nozzle 20, compared with continuous spraying. Thus, the slurry 23 can be well supplied to the surface to be coated, and the slurry 23 that has been applied can be reduced from being blown off by the air flow. Accordingly, good adhesion between the upper surface of the light-emitting element 2 and the surface of the fluorescent material layer 3 can be achieved.

Spraying the slurry 23 intermittently can reduce the quantity to be sprayed per unit time. Thus, the spray nozzle 20 can be moved at a low velocity while spraying a small quantity of the slurry 23. Accordingly, the fluorescent material layer 3 with a uniform thickness can be formed even on an uneven surface.

After spray coating the slurry 23 on the light-emitting element 2 as described above, the resin in the slurry 23 is cured. In the curing of the resin, it is preferable that the color tone be tested after temporary curing and before main curing. Examples of conditions in the temporary curing include that a temperature of 100° C. is maintained for five minutes. Examples of conditions in the main curing include that a temperature of 150° C. is maintained for four hours.

Figure 2A:
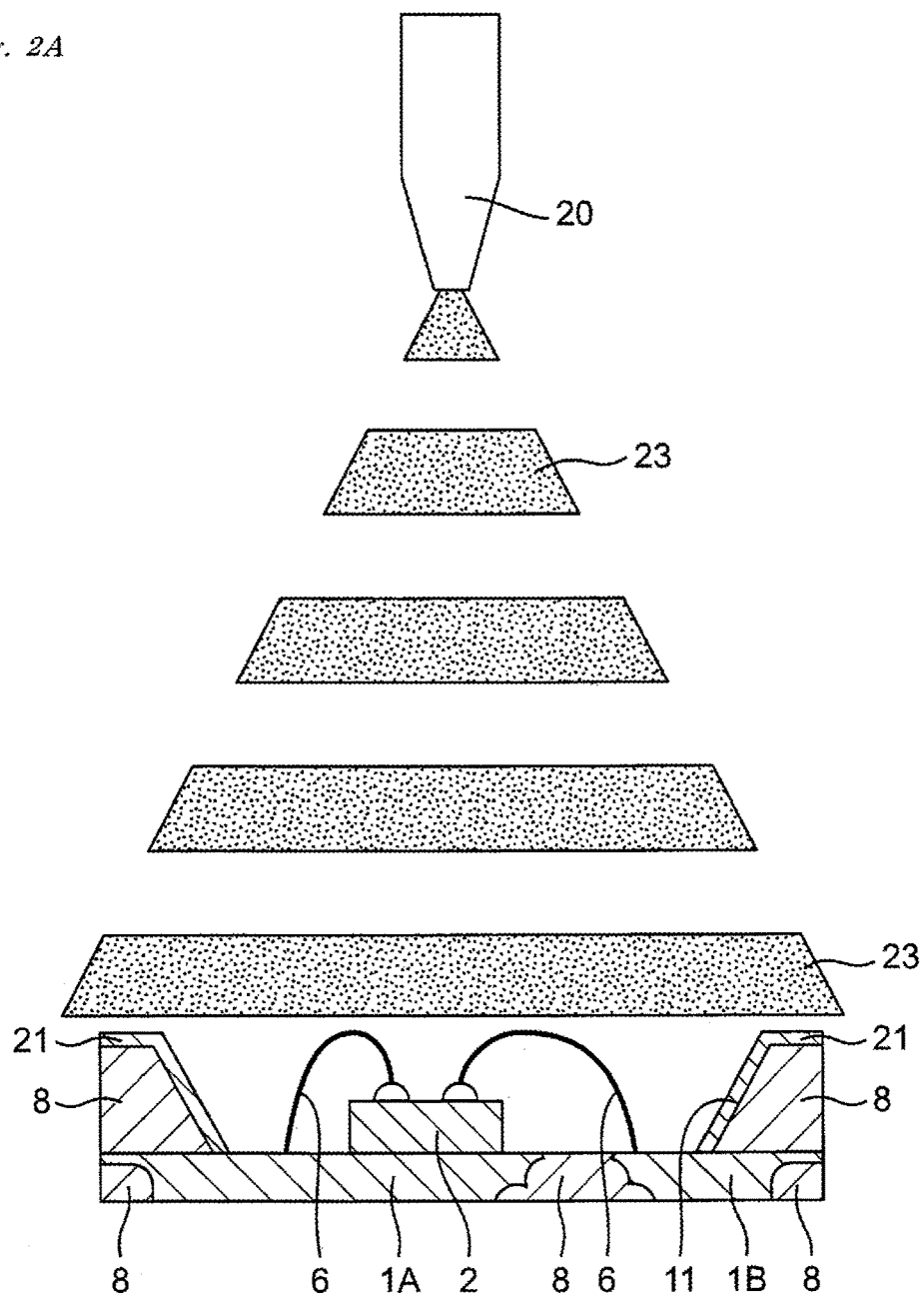
FIGS. 2A and 2B are schematic cross-sectional diagrams illustrating an embodiment of a method for manufacturing the light-emitting device 100.
Figure 2B:
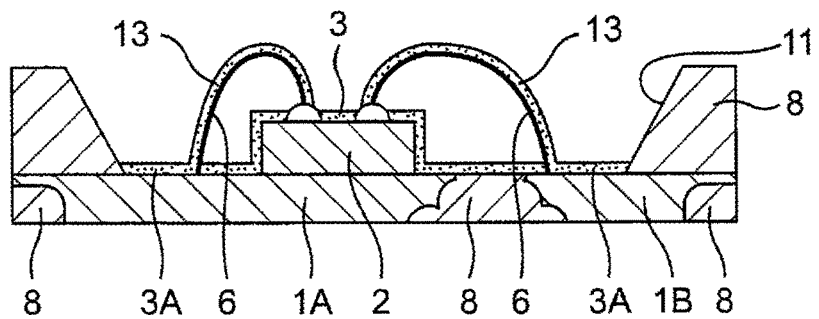

By this procedure, the fluorescent material layer 3 including the fluorescent-material-layer extending portion 3A and the second fluorescent material layers 13 can be formed as shown in FIG. 2B.

(3) Forming Light-Transmissive Layer

Figure 3A:
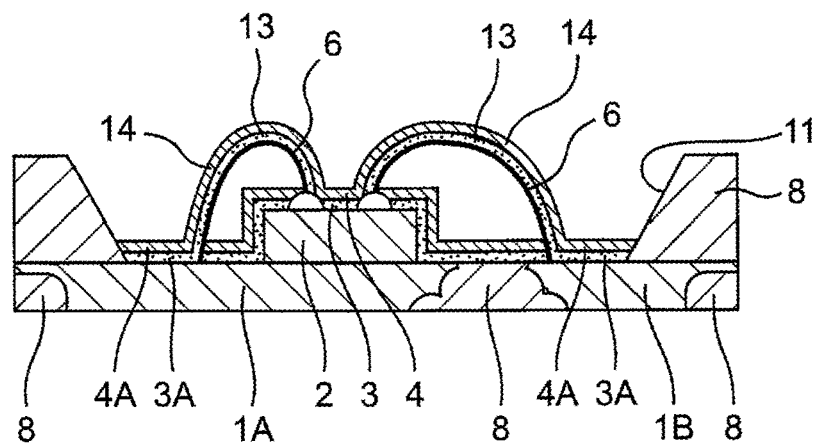
FIGS. 3A to 3C are schematic cross-sectional diagrams illustrating the embodiment of the method for manufacturing the light-emitting device 100.

Next, as shown in FIG. 3A, the light-transmissive layer 4 is formed on at least part of the side surfaces and at least part of the upper surface of the light-emitting element 2 with the fluorescent material layer 3 sandwiched therebetween. Preferably, the light-transmissive layer 4 is formed so that the roughness of the surface on the side opposite to the fluorescent material layer 3 will be smaller than the roughness of the surface of the fluorescent material layer 3 on the light-transmissive layer 4 side. More preferably, the light-transmissive layer 4 is formed so that the roughness of the surface of the light-transmissive layer 4 on the side opposite to the fluorescent material layer 3 will be equal to or smaller than half the roughness of the surface of the fluorescent material layer 3 on the light-transmissive layer 4 side. For example, the light-transmissive layer 4 is formed so that the roughness of the surface on the side opposite to the fluorescent material layer 3 will be 3 μm to 8 μm.

Such light-transmissive layer 4 may be formed by any method such as spraying as in the case of the fluorescent material layer 3. Alternatively, the light-transmissive layer 4 may be formed by locating, in a mold, the resin package 8 including the light-emitting element 2 on which the above fluorescent material layer 3 has been formed, and then pouring the resin into the mold (potting).

In the case where the light-transmissive layer 4 is formed by spraying, the slurry 23 may be provided from only the resin and the solvent, and the other conditions may be the same as the above conditions in spraying for forming the fluorescent material layer 3.

To enhance the viscosity of the slurry 23 or to improve the light diffusivity of the light-transmissive layer 4 to be obtained, the slurry 23 may be provided from the resin, the solvent, and the filler. For example, the mass ratio of resin:solvent:filler may be 10:25:1.

To make the roughness of the surface on the side opposite to the fluorescent material layer 3 be a small value such as a value in the range of 3 μm to 8 μm, applying the light-transmissive layer 4, so that the light-transmissive layer 4 will be comparatively thick, is necessitated. For example, the thickness of the light-transmissive layer 4 is preferably 5 μm to 20 μm.

On the other hand, in the case where the light-transmissive layer 4 is formed by potting, it is easier to make the roughness of the surface on the side opposite to the fluorescent material layer 3 be a small value such as a value in the range of 3 μm to 8 μm than in the case of spraying.

As described above, the light-transmissive layer 4 may be formed by spraying or potting. In this case, the light-transmissive layer 4 may include at least one of the light-transmissive-layer extending portion 4A and the second light-transmissive layers 14. At least one of the light-transmissive-layer extending portion 4A and the second light-transmissive layers 14 may be formed at the time of forming the light-transmissive layer 4.

(4) Forming Reflective Layer

Figure 3B:
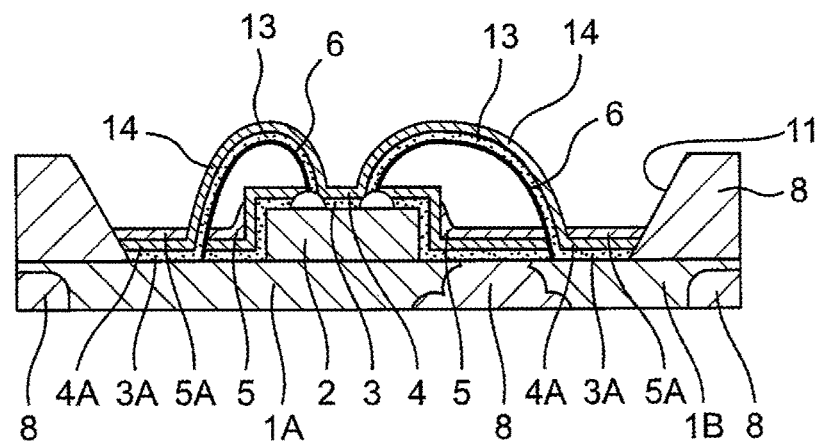

Next, as shown in FIG. 3B, the reflective layer 5 is formed on at least part of the side surfaces of the light-emitting element 2 with the fluorescent material layer 3 and the light-transmissive layer 4 sandwiched therebetween so that at least part of the upper surface of the light-emitting element 2 will be exposed. The reflective layer 5 may include the reflective-layer extending portion 5A.

The reflective layer 5 may be formed by any method. The reflective layer 5 can be formed, for example, by potting. By employing potting, the reflective layer 5 can be easily formed adjacent to the light-emitting element 2 except for the upper surface of the light-emitting element 2.

(5) Forming Seal Member

Figure 3C:
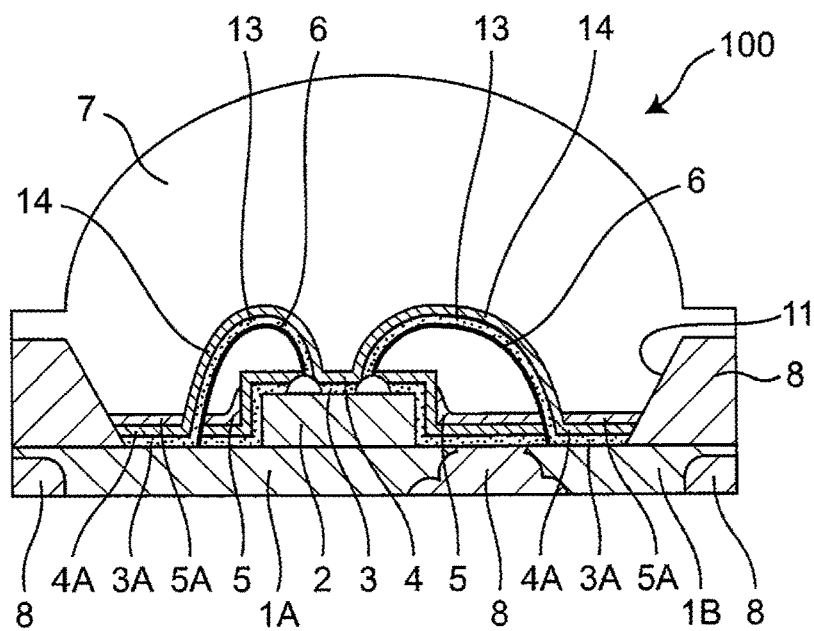

As shown in FIG. 3C, the seal member 7 may be formed as appropriate.

The seal member 7 may be formed by any method. The seal member 7 may be formed, for example, by potting.

The invention claimed is:

1. A light-emitting device, comprising:
  a substrate;
  a light-emitting element disposed on the substrate, the light-emitting element having at least one side surface and an upper surface;
  a fluorescent material layer disposed on the at least one side surface and the upper surface of the light-emitting element;
  a light-transmissive layer disposed on the at least one side surface and the upper surface of the light-emitting element with the fluorescent material layer sandwiched between the light-emitting element and the light-transmissive layer; and
  a reflective layer covering the at least one side surface with the fluorescent material layer and the light-transmissive layer sandwiched between the light-emitting element and the reflective layer, the reflective layer not being disposed above at least the upper surface of the light-emitting element,
  wherein the reflective layer is disposed above the light-transmissive layer and has a contact portion in direct contact with the light-transmissive layer, the contact portion is only provided at a position lower than the height of an upper surface of the light-transmissive layer above the upper surface of the light-emitting element with respect to a height from the substrate.

2. The light-emitting device according to claim 1, wherein a surface roughness of a surface of the fluorescent material layer, the surface being adjacent to the light-transmissive layer, is larger than a roughness of a surface of the light-transmissive layer, the surface being opposite to a surface adjacent to the fluorescent material layer.

3. The light-emitting device according to claim 1, wherein a surface roughness of a surface of the fluorescent material layer, the surface being adjacent to the light-transmissive layer, is equal to or larger than twice a surface roughness of a surface of the light-transmissive layer, the surface being opposite to a surface adjacent to the fluorescent material layer.

4. The light-emitting device according to claim 1, the light-emitting device further comprising:
wiring on the substrate;
at least one metal wire electrically connecting the wiring to the light-emitting element, the at least one metal wire having an upper surface and a lower surface;
a second fluorescent material layer on at least part of the upper surface of the metal wire; and
a second light-transmissive layer on at least part of the second fluorescent material layer, the fluorescent material layer not being disposed on at least part of the lower surface.

5. The light-emitting device according to claim 1,
wherein the substrate has a depressed portion, and
wherein the light-emitting element is disposed in the depressed portion.

6. The light-emitting device according to claim 1,
wherein the fluorescent material layer comprises a fluorescent-material-layer extending portion extending on the substrate,
wherein the light-transmissive layer comprises a light-transmissive-layer extending portion extending on at least part of the fluorescent-material-layer extending portion, and
wherein the reflective layer is disposed on at least part of the light-transmissive-layer extending portion.

7. The light-emitting device according to claim 6,
wherein at least one metal wire penetrates the fluorescent-material-layer extending portion, the light-transmissive-layer extending portion, and the reflective layer, wherein the at least one metal wire electrically connects wiring on the substrate to the light-emitting element, the at least one metal wire having an upper surface and a lower surface.

8. The light-emitting device according to claim 7,
wherein the fluorescent-material-layer extending portion, the light-transmissive-layer extending portion, and the reflective layer are disposed in a depressed portion of the substrate, wherein the light-emitting element is disposed in the depressed portion.

9. The light-emitting device according to claim 1, the light-emitting device further comprising a seal member covering at least part of the light-transmissive layer and at least part of the reflective layer.

10. The light-emitting device according to claim 1,
wherein the light-emitting device is flip-chip mounted.

11. The light-emitting device according to claim 2,
wherein the roughness of the surface of the light-transmissive layer, the surface being opposite to a surface adjacent to the fluorescent material layer, is 8 μm or less.

12. The light-emitting device according to claim 4,
wherein the fluorescent material layer and the second fluorescent material layer are formed as an integrated body.

13. The light-emitting device according to claim 4,
wherein the fluorescent material layer and the second fluorescent material layer are formed separately.

14. The light-emitting device according to claim 1,
wherein a thickness of the fluorescent material layer is 20 μm to 100 μm.

15. The light-emitting device according to claim 1,
wherein a mean particle diameter of a fluorescent material contained in the fluorescent material layer is 3 μm to 30 μm.

* * * * *